(12) United States Patent
Wang et al.

(10) Patent No.: US 10,908,923 B2
(45) Date of Patent: Feb. 2, 2021

(54) APPLICATION STARTING METHOD AND TERMINAL DEVICE

(71) Applicant: HUAWEI TECHNOLOGIES CO., LTD., Guangdong (CN)

(72) Inventors: Kun Wang, Shenzhen (CN); Nan Yang, Shenzhen (CN); Jun Yu, Shenzhen (CN); Xi Li, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/346,362

(22) PCT Filed: Oct. 31, 2016

(86) PCT No.: PCT/CN2016/104085
§ 371 (c)(1),
(2) Date: Apr. 30, 2019

(87) PCT Pub. No.: WO2018/076353
PCT Pub. Date: May 3, 2018

(65) Prior Publication Data
US 2019/0272182 A1    Sep. 5, 2019

(51) Int. Cl.
| | | |
|---|---|---|
| *G06F 9/46* | (2006.01) |
| *G06F 9/445* | (2018.01) |
| *G01C 21/20* | (2006.01) |
| *G01R 33/00* | (2006.01) |
| *H04L 29/08* | (2006.01) |
| *H04W 4/00* | (2018.01) |

(52) U.S. Cl.
CPC .......... *G06F 9/4451* (2013.01); *G01C 21/20* (2013.01); *G01R 33/00* (2013.01); *H04L 67/306* (2013.01); *H04W 4/00* (2013.01)

(58) Field of Classification Search
CPC ........ G06F 9/4451; G01C 21/20; G01R 33/00
See application file for complete search history.

(56) References Cited

U.S. PATENT DOCUMENTS

| | | | |
|---|---|---|---|
| 2005/0232088 A1* | 10/2005 | Nanba | ............... G11B 11/10541 369/13.05 |
| 2011/0098033 A1 | 4/2011 | Britz et al. | |
| 2012/0172086 A1 | 7/2012 | Choi et al. | |

(Continued)

FOREIGN PATENT DOCUMENTS

| | | |
|---|---|---|
| CN | 102546925 A | 7/2012 |
| CN | 103312902 A | 9/2013 |

(Continued)

OTHER PUBLICATIONS

Extended European Search Report issued in European Application No. 16919849.6 dated Oct. 8, 2019, 7 pages.

(Continued)

*Primary Examiner* — Camquy Truong
(74) *Attorney, Agent, or Firm* — Fish & Richardson P.C.

(57) ABSTRACT

The present disclosure relates to application starting methods and terminal devices. One example method includes detecting, by a terminal device, magnetic field strength, and when the magnetic field strength is greater than a magnetic field strength threshold, starting, by the terminal device, an application corresponding to the magnetic field strength threshold.

17 Claims, 5 Drawing Sheets

(56) References Cited

U.S. PATENT DOCUMENTS

| | | | |
|---|---|---|---|
| 2013/0102300 A1 | 4/2013 | Sigal et al. | |
| 2013/0226401 A1 | 8/2013 | Wang et al. | |
| 2015/0179281 A1* | 6/2015 | Lu | G06F 11/073 714/718 |
| 2015/0246614 A1* | 9/2015 | Dames | H05K 9/0075 191/10 |
| 2016/0216304 A1* | 7/2016 | Sekelsky | B60L 53/126 |
| 2016/0229304 A1* | 8/2016 | Bildstein | B60L 53/39 |
| 2016/0246265 A1* | 8/2016 | An | G05B 1/01 |

FOREIGN PATENT DOCUMENTS

| | | |
|---|---|---|
| CN | 103336695 A | 10/2013 |
| CN | 105025440 A | 11/2015 |
| CN | 105549987 A | 5/2016 |
| CN | 105677396 A | 6/2016 |
| CN | 106028262 A | 10/2016 |
| JP | 2001290670 A | 10/2001 |
| WO | 2016123862 A1 | 8/2016 |

OTHER PUBLICATIONS

Goodwin, A. [online], "Garmins new car kit uses NFC to autolaunch navigation," Road Show by CNET, dated Nov. 18, 2013, [retrieved on Sep. 25, 2019], retrieved from: URL<https://cnet.com/roadshow/news/garmins-new-car-kit-uses-nfc-to-autolaunch-navigation/>, XP-002794578, 2 pages.

Office Action issued in Chinese Application No. 201680087916.2 dated Dec. 25, 2019, 12 pages (with English translation).

PCT International Search Report and Written Opinion issued in International Application No. PCT/CN2016/104085 dated May 31, 2017, 16 pages (with English translation).

Office Action issued in Australian Application No. 2016427305 dated Sep. 8, 2020, 5 pages.

\* cited by examiner

APPLICATION STARTING METHOD AND TERMINAL DEVICE

CROSS-REFERENCE TO RELATED APPLICATIONS

This application is a national stage of International Application No. PCT/CN2016/104085, filed on Oct. 31, 2016, which is hereby incorporated by reference in its entirety.

TECHNICAL FIELD

The present invention relates to the field of mobile terminal technologies, and in particular, to an application starting method and a terminal device.

BACKGROUND

On an existing mobile terminal device, many applications such as a navigation application, a WeChat application, a music application, and a video application are installed. Each application is corresponding to one application scenario. For example, the navigation application is used for map navigation, and the WeChat application is used for chatting.

Figure 1:
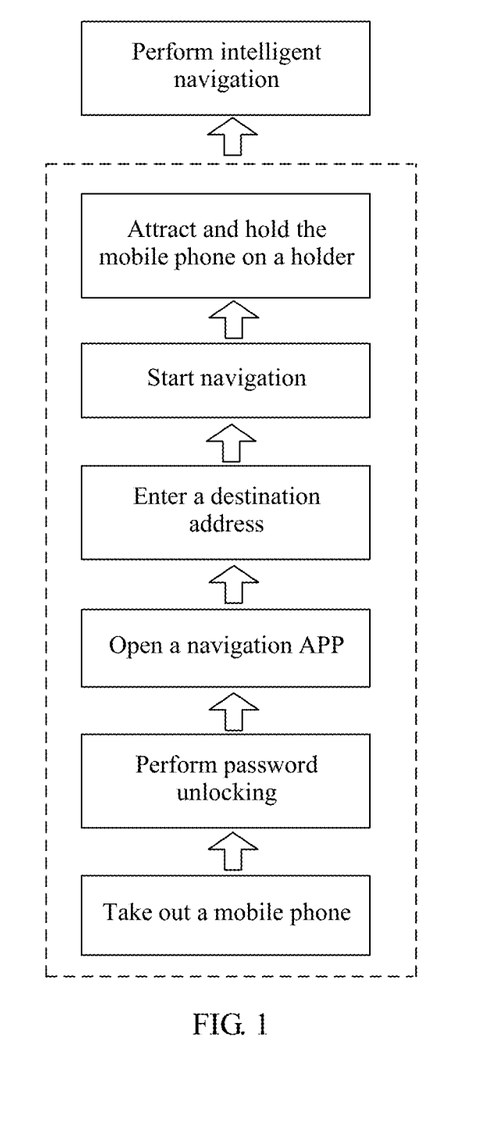
FIG. 1 is a schematic diagram of existing navigation application starting.

However, in the prior art, each application needs to be started through human intervention. There are many applications on an existing terminal device, and it takes a user some time to search for an application, start the application, and start to use the application. Consequently, the entire experience is not intelligent. For example, when the user needs to use a navigation application during driving, the user needs to take out a mobile phone, unlock the mobile phone using a password, open the navigation application, enter a destination address, start navigation, attach the mobile phone to a holder, and perform intelligent navigation. Therefore, the navigation can be completed on the mobile phone only after at least six actions are performed, and consequently the operation process is complicated and user experience is poor, which is shown in FIG. 1.

Therefore, an existing application starting method is not intelligent enough, and it takes the user several minutes in average before starting to use an application, causing a complex procedure and poor experience.

SUMMARY

Embodiments of the present invention relate to an application starting method and a terminal device, so as to implement low-cost and simple user experience.

According to a first aspect, an embodiment of the present invention provides an application starting method, where the method includes: detecting, by a terminal device, magnetic field strength; and starting, by the terminal device when the magnetic field strength is greater than a magnetic field strength threshold, an application corresponding to the magnetic field strength threshold.

In this embodiment of the present invention, magnetic field strength of an external environment is detected, so that when the magnetic field strength of the external environment is greater than the magnetic field strength threshold, the application corresponding to the magnetic field strength threshold is started. Therefore, low-cost and simple user experience is implemented.

In a possible implementation, the method further includes: detecting, by the terminal device, light intensity; and when the magnetic field strength is greater than the magnetic field strength threshold and the light intensity is not less than a light intensity threshold, starting, by the terminal device, the application.

In this embodiment of the present invention, the magnetic field strength and the light intensity are jointly detected, so as to eliminate accidental trigger occurring when the terminal device and another object whose magnetic field strength exceeds the threshold are placed together but the light intensity is very low. For example, when a mobile phone and a headset or another mobile phone are placed in a bag or a pocket, accidental trigger can be eliminated by jointly detecting the light intensity.

In a possible implementation, the method further includes: detecting, by the terminal device, a distance from an obstacle to the terminal device; and when the magnetic field strength is greater than the magnetic field strength threshold and the distance is greater than a distance threshold, starting, by the terminal device, the application.

In this embodiment of the present invention, the magnetic field strength and the distance from the obstacle to the terminal device are jointly detected, so as to eliminate accidental trigger occurring when the terminal device and another object whose magnetic field strength exceeds the threshold are placed together. For example, when a mobile phone and a headset or another mobile phone are placed together, accidental trigger can be eliminated by jointly detecting the distance from the obstacle.

In a possible implementation, the method further includes: detecting, by the terminal device, motion acceleration of the terminal device; and when the magnetic field strength is greater than the magnetic field strength threshold and the acceleration is not less than an acceleration threshold, starting, by the terminal device, the application.

In a possible implementation, the method further includes: detecting, by the terminal device, a motion speed of the terminal device; and when the magnetic field strength is greater than the magnetic field strength threshold and the speed is not less than a speed threshold, starting, by the terminal device, the application.

In a possible implementation, the method further includes: detecting, by the terminal device, a change rate of motion acceleration of the terminal device; and when the magnetic field strength is greater than the magnetic field strength threshold and the change rate is not less than a change rate threshold, starting, by the terminal device, the application.

In this embodiment of the present invention, the magnetic field strength and the motion acceleration, the motion speed, or the change rate of the motion acceleration of the terminal device are jointly detected, so that accidental trigger can be eliminated in combination with a parameter of motion occurring when the terminal device is placed on a magnetic holder, or a speed at which the terminal device moves with a vehicle when a magnetic holder is inside the vehicle.

In a possible implementation, the method further includes: detecting, by the terminal device, whether a Bluetooth device connected to the terminal device is an in-vehicle Bluetooth device; and when the magnetic field strength is greater than the magnetic field strength threshold and the Bluetooth device connected to the terminal device is an in-vehicle Bluetooth device, starting, by the terminal device, the application.

In this embodiment of the present invention, whether the Bluetooth device connected to the terminal device is an in-vehicle Bluetooth device is detected, so as to determine whether the terminal device is inside a vehicle. When the terminal device is inside the vehicle and the detected magnetic field strength is greater than the magnetic field strength threshold, a navigation application is started.

In a possible implementation, the method further includes: detecting, by the terminal device, light intensity; detecting, by the terminal device, a distance from an obstacle to the terminal device; detecting, by the terminal device, motion acceleration of the terminal device; detecting, by the terminal device, a motion speed of the terminal device; detecting, by the terminal device, a change rate of the motion acceleration of the terminal device; detecting, by the terminal device, whether a Bluetooth device connected to the terminal device is an in-vehicle Bluetooth device; and the starting, by the terminal device when the magnetic field strength is greater than a magnetic field strength threshold, an application corresponding to the magnetic field strength threshold includes: when the magnetic field strength is greater than the magnetic field strength threshold and at least two of the following conditions are met: the light intensity is not less than a light intensity threshold, the distance is greater than a distance threshold, the acceleration is not less than an acceleration threshold, the speed is not less than a speed threshold, the change rate is not less than a change rate threshold, and the Bluetooth device connected to the terminal device is an in-vehicle Bluetooth device, starting, by the terminal device, the application corresponding to the magnetic field strength threshold.

In a possible implementation, the application is specifically a navigation application.

In this embodiment of the present invention, the magnetic field strength and the other parameters are jointly detected, so that accidental trigger can be completely eliminated. Therefore, low-cost, simple, and intelligent user experience is implemented. In this way, the navigation application can be quickly started, so as to improve user experience.

According to a second aspect, an embodiment of the present invention provides a terminal device, where the terminal device includes a magnetic induction sensor and a processor, where the magnetic induction sensor is configured to detect magnetic field strength; and the processor is configured to: when the magnetic field strength is not less than a magnetic field strength threshold, start an application corresponding to the magnetic field strength threshold.

In this embodiment of the present invention, the magnetic induction sensor built in the terminal device detects magnetic field strength of an external environment, so that when the magnetic field strength of the external environment is greater than the magnetic field strength threshold, the application corresponding to the magnetic field strength threshold is started. Therefore, low-cost and simple user experience is implemented.

In a possible implementation, the terminal device further includes a light intensity sensor, where the light intensity sensor is configured to detect light intensity; and the processor is specifically configured to: when the magnetic field strength is greater than the magnetic field strength threshold and the light intensity is not less than a light intensity threshold, start the application.

In a possible implementation, the terminal device further includes a proximity sensor, where the proximity sensor is configured to detect a distance from an obstacle to the terminal device; and the processor is specifically configured to: when the magnetic field strength is greater than the magnetic field strength threshold and the distance is greater than a distance threshold, start the application.

In a possible implementation, the terminal device further includes an accelerometer, where the accelerometer is configured to detect motion acceleration of the terminal device; and the processor is specifically configured to: when the magnetic field strength is greater than the magnetic field strength threshold and the acceleration is not less than an acceleration threshold, start the application.

In a possible implementation, the processor is further configured to: obtain a motion speed of the terminal device based on the acceleration; and when the magnetic field strength is greater than the magnetic field strength threshold and the speed is not less than a speed threshold, start the application.

In a possible implementation, the processor is further configured to: obtain a change rate of motion acceleration of the terminal device based on the acceleration; and when the magnetic field strength is greater than the magnetic field strength threshold and the change rate is not less than a change rate threshold, start the application.

In this embodiment of the present invention, the magnetic induction sensor and the foregoing plurality of other sensors may jointly perform detection, so that accidental trigger can be completely eliminated. Therefore, low-cost, simple, and intelligent user experience is implemented.

In a possible implementation, the terminal device further includes a Bluetooth module, where the Bluetooth module is configured to detect whether a Bluetooth device connected to the Bluetooth module is an in-vehicle Bluetooth device; and the processor is specifically configured to: when the magnetic field strength is greater than the magnetic field strength threshold and the Bluetooth device connected to the Bluetooth module is an in-vehicle Bluetooth device, start the application.

In a possible implementation, the terminal device further includes: a light intensity sensor, configured to detect light intensity; a proximity sensor, configured to detect a distance from an obstacle to the terminal device; an accelerometer, configured to detect motion acceleration of the terminal device, where the processor is further configured to obtain a motion speed of the terminal device based on the acceleration, and the terminal device detects the light intensity; and the processor is further configured to obtain a change rate of the motion acceleration of the terminal device based on the acceleration; and a Bluetooth module, configured to detect whether a Bluetooth device connected to the Bluetooth module is an in-vehicle Bluetooth device, where the processor is specifically configured to: when the magnetic field strength is greater than the magnetic field strength threshold and at least two of the following conditions are met: the light intensity is not less than a light intensity threshold, the distance is greater than a distance threshold, the acceleration is not less than an acceleration threshold, the speed is not less than a speed threshold, the change rate is not less than a change rate threshold, and the Bluetooth device connected to the Bluetooth module is an in-vehicle Bluetooth device, start the application corresponding to the magnetic field strength threshold.

In a possible implementation, the application is specifically a navigation application.

In this embodiment of the present invention, the magnetic induction sensor is applied to a vehicle, so that the plurality of sensors of the terminal device detect the magnetic field strength and the other parameters, thereby implementing low-cost and simple experience.

According to a third aspect, an embodiment of the present invention provides a terminal device, where the terminal device includes a magnetic field strength detection unit, configured to detect magnetic field strength; and an application starting unit, configured to: when the magnetic field strength is greater than a magnetic field strength threshold, start an application corresponding to the magnetic field strength threshold.

In a possible implementation, the terminal device further includes a light intensity detection unit, configured to detect light intensity, where the application starting unit is specifically configured to: when the magnetic field strength is greater than the magnetic field strength threshold and the light intensity is not less than a light intensity threshold, start the application.

In a possible implementation, the terminal device further includes an obstacle distance detection unit, configured to detect a distance from an obstacle to the terminal device, where the application starting unit is specifically configured to: when the magnetic field strength is greater than the magnetic field strength threshold and the distance is greater than a distance threshold, start the application.

In a possible implementation, the terminal device further includes an acceleration detection unit, configured to detect motion acceleration of the terminal device, where the application starting unit is specifically configured to: when the magnetic field strength is greater than the magnetic field strength threshold and the acceleration is not less than an acceleration threshold, start the application.

In a possible implementation, the terminal device further includes a speed detection unit, configured to detect a motion speed of the terminal device, where the application starting unit is specifically configured to: when the magnetic field strength is greater than the magnetic field strength threshold and the speed is not less than a speed threshold, start the application.

In a possible implementation, the terminal device further includes an acceleration change rate detection unit, configured to detect a change rate of motion acceleration of the terminal device, where the application starting unit is specifically configured to: when the magnetic field strength is greater than the magnetic field strength threshold and the change rate is not less than a change rate threshold, start the application.

In a possible implementation, the terminal device further includes a Bluetooth device detection unit, configured to detect whether a Bluetooth device connected to the Bluetooth device detection unit is an in-vehicle Bluetooth device, where the application starting unit is specifically configured to: when the magnetic field strength is greater than the magnetic field strength threshold and the Bluetooth device detection unit detects that the connected Bluetooth device is an in-vehicle Bluetooth device, start the application.

In a possible implementation, the terminal device further includes: a light intensity detection unit, configured to detect light intensity; an obstacle distance detection unit, configured to detect a distance from an obstacle to the terminal device; an acceleration detection unit, configured to detect motion acceleration of the terminal device; a speed detection unit, configured to detect a motion speed of the terminal device; an acceleration change rate detection unit, configured to detect a change rate of the motion acceleration of the terminal device; and a Bluetooth device detection unit, configured to detect whether a Bluetooth device connected to the Bluetooth device detection unit is an in-vehicle Bluetooth device, where the application starting unit is specifically configured to: when the magnetic field strength is greater than the magnetic field strength threshold and at least two of the following conditions are met: the light intensity is not less than a light intensity threshold, the distance is greater than a distance threshold, the acceleration is not less than an acceleration threshold, the speed is not less than a speed threshold, the change rate is not less than a change rate threshold, and the Bluetooth device detection unit detects that the connected Bluetooth device is an in-vehicle Bluetooth device, start the application corresponding to the magnetic field strength threshold.

In a possible implementation, the application is specifically a navigation application.

According to the application starting method and the terminal device provided in the embodiments of the present invention, the magnetic induction sensor built in the terminal device detects magnetic field strength of an external environment, so that when the magnetic field strength of the external environment is greater than the magnetic field strength threshold, the application corresponding to the magnetic field strength threshold can be started. According to the terminal device provided in the embodiments of the present invention, the application is started more quickly and more conveniently by detecting the magnetic field strength, so as to implement low-cost and simple user experience.

BRIEF DESCRIPTION OF DRAWINGS

To describe the technical solutions in the embodiments of the present invention more clearly, the following briefly describes the accompanying drawings required for describing the embodiments. Apparently, the accompanying drawings in the following description show merely some embodiments of the present invention, and a person of ordinary skill in the art may derive other drawings from these accompanying drawings without creative efforts.

DESCRIPTION OF EMBODIMENTS

To make the objectives, technical solutions, and advantages of the embodiments of the present invention clearer, the following describes the technical solutions in the embodiments of the present invention with reference to the accompanying drawings in the embodiments of the present invention. Apparently, the described embodiments are some rather than all of the embodiments of the present invention. All other embodiments obtained by a person of ordinary skill in the art based on the embodiments of the present invention without creative efforts shall fall within the protection scope of the present invention.

An "application scenario" in the embodiments of the present invention is a usage scenario of an application on a terminal device. For example, when a user needs to watch a video, the user starts a video application to meet a user requirement. In other words, a related application needs to be used to meet a requirement of the application scenario.

Figure 2:
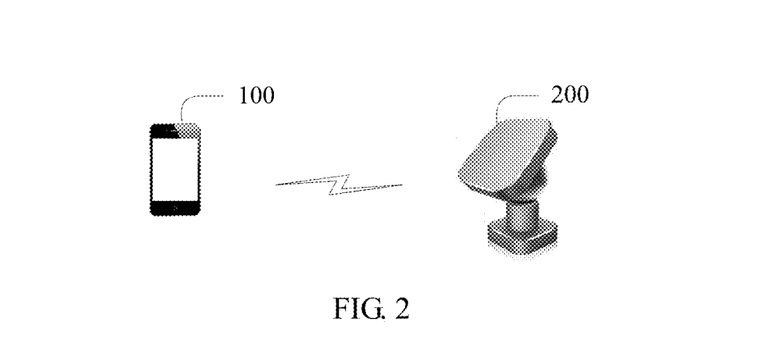
FIG. 2 is a schematic architectural diagram of an application starting system according to an embodiment of the present invention.

FIG. 2 is used as an example below to describe an application starting system according to an embodiment of the present invention. FIG. 2 is a schematic architectural diagram of an application starting system according to an embodiment of the present invention. As shown in FIG. 2, the system provided in this embodiment of the present invention includes a terminal device 100 and a magnetic holder 200. An iron sheet may be affixed to a housing of the terminal device 100, so that the terminal device 100 can be attached to the magnetic holder 200. Alternatively, the terminal device 100 may be directly attached to the magnetic holder 200 by using a metal housing of the terminal device 100. The magnetic holder 200 includes a magnet, configured to generate a magnetic field, so that the terminal device 100 can be attached to the magnetic holder 200.

The terminal device 100 includes a magnetic induction sensor that may detect magnetic field strength of an environment in which the terminal device 100 is located. When the terminal device 100 is in a normal state, the detected magnetic field strength is a value of a geomagnetic field, for example, 40 µT to 60 µT. When the terminal device 100 is attached to the magnetic holder 200, the detected magnetic field strength is related to field strength of the magnet of the magnetic holder 200. The magnet of the magnetic holder 200 is designed, so that the magnetic field strength of the magnet is different from strength of the geomagnetic field. In addition, a magnetic field strength threshold is set, and the magnetic field strength threshold is related to the field strength of the magnet of the magnetic holder 200. When the magnetic field strength detected by the terminal device 100 is greater than the magnetic field strength threshold, the terminal device 100 starts an application corresponding to the magnetic field strength threshold.

In an example, the magnetic field strength of the magnet of the magnetic holder 200 is 200 µT. Therefore, the magnetic field strength detected by the magnetic induction sensor of the terminal device 100 may be approximately 200 µT. In this case, the magnetic field strength threshold may be set to 150 µT. When the magnetic field strength detected by the terminal device 100 is greater than 150 µT, the terminal device 100 starts an application corresponding to the magnetic field strength threshold 150 µT.

In some embodiments, the terminal device 100 is a smartphone. Certainly, a person skilled in the art may understand that, these embodiments may be further applied to another terminal device in addition to the smartphone. It may be assumed that the application corresponding to the magnetic field strength threshold 150 µT is a navigation application such as Baidu Maps or Amap. In a specific application scenario, the magnetic holder 200 is fastened inside a vehicle. When a mobile phone is attached to the magnetic holder 200, the mobile phone detects, by using a magnetic induction sensor built in the mobile phone, that a magnetic field strength value is greater than the specified magnetic field strength threshold, and the mobile phone starts the navigation application, so that a user performs driving navigation.

Further, in another possible scenario, the magnetic field strength detected by the terminal device 100 may exceed the specified magnetic field strength threshold. Consequently, the application is accidentally started. In other words, accidental trigger occurs. The accidental trigger means that an application corresponding to the scenario is still started when the terminal device is not in an application scenario.

In this embodiment of the present invention, the accidental trigger is eliminated in the following several determining manners.

In a scenario, when a mobile phone A and a headset or a mobile phone B are placed together, the mobile phone A may detect magnetic field strength of the headset or the mobile phone B. It can be learned by a person skilled in the art that a mobile phone and a headset each have a loudspeaker. The loudspeaker generates a magnetic field. In some embodiments of the present invention, the magnetic induction sensor and a loudspeaker of the terminal device 100 are separately integrated, so that a magnetic field of the loudspeaker built in the terminal device 100 does not interfere with detection performed by the magnetic induction sensor of the terminal device 100. For example, the loudspeaker is disposed in a bottom area of the mobile phone terminal device, and the magnetic induction sensor is disposed in a top area of the mobile phone terminal device. When the mobile phone A and the headset or the mobile phone B are placed together, and magnetic field strength of a loudspeaker of the headset or the mobile phone B is also greater than the specified magnetic field strength threshold, the mobile phone A may use an optical sensor or a proximity sensor (a distance sensor) built in the mobile phone A, to eliminate accidental trigger occurring when the mobile phone A and the headset or the mobile phone B are placed together. Specifically, the mobile phone A and the headset or the mobile phone B are usually placed together in a pocket or a bag. In this case, light intensity detected by the optical sensor is very low, or a distance from an obstacle that is detected by the proximity sensor is very short. The "obstacle" in this embodiment of the present invention is specific to the terminal device A, and an object detected by the proximity sensor of the terminal device A is an obstacle.

Specifically, the terminal device 100 may detect light intensity; and when the magnetic field strength is greater than the specified magnetic field strength threshold and the light intensity is not less than a specified light intensity threshold, the terminal device 100 starts the application corresponding to the magnetic field strength threshold. Alternatively, the terminal device 100 may detect a distance from an obstacle; and when the magnetic field strength is greater than the specified magnetic field strength threshold and the distance from the obstacle is not less than a specified distance threshold, the terminal device 100 starts the application corresponding to the magnetic field strength threshold.

In a scenario, the mobile phone held by the user may be near the magnetic holder. In this case, detected magnetic field strength may be greater than the specified magnetic field strength threshold, and consequently accidental trigger occurs. When the mobile phone is placed on the magnetic holder, the mobile phone moves. The mobile phone may use an accelerometer built in the mobile phone, to eliminate accidental application starting when the mobile phone is near the magnetic holder. In this case, motion acceleration of the mobile phone may be relatively high. When the mobile phone is in contact with the magnetic holder and stays on the holder, the mobile phone may vibrate, indicating that a change rate of the motion acceleration of the mobile phone suddenly changes. The mobile phone vibrates when being in contact with the holder, and inverse acceleration occurs on the mobile phone. In this case, the change rate of the acceleration of the mobile phone may be relatively high.

Specifically, the terminal device 100 may detect motion acceleration of the terminal device 100; and when the magnetic field strength is greater than the specified magnetic field strength threshold and the acceleration is not less than a specified acceleration threshold, the terminal device starts the application corresponding to the magnetic field strength threshold. Alternatively, the terminal device 100 may detect a change rate of motion acceleration of the terminal device 100; and when the magnetic field strength is greater than the specified magnetic field strength threshold and the change rate is not less than a specified change rate threshold, the terminal device starts the application corresponding to the magnetic field strength threshold.

In a scenario, when the magnetic holder is inside a moving vehicle, a motion speed of the mobile phone is generated due to motion of the vehicle. In this case, the motion speed of the mobile phone may be relatively high. The speed of the mobile phone may be obtained by using an accelerometer. The speed of the mobile phone is detected, so as to eliminate accidental trigger occurring when the mobile phone is in another magnetic field range that exceeds the specified magnetic field strength threshold. Specifically, the terminal device 100 may detect a motion speed of the terminal device 100; and when the magnetic field strength is greater than the specified magnetic field strength threshold and the speed is not less than a specified speed threshold, the terminal device starts the application corresponding to the magnetic field strength threshold.

In addition, the terminal device 100 may alternatively determine whether the terminal device 100 is connected to in-vehicle Bluetooth, to determine whether the terminal device 100 is inside the vehicle. In a Bluetooth protocol, a dev_class field is used to identify a type of a Bluetooth device. The terminal device 100 may determine, by using the field, whether a Bluetooth device connected to the terminal device 100 is an in-vehicle Bluetooth device, and if the Bluetooth device connected to the terminal device 100 is an in-vehicle Bluetooth device, the terminal device 100 may determine that the terminal device 100 is inside the vehicle. In other words, when the terminal device 100 detects that the magnetic field strength is greater than the magnetic field strength threshold and the Bluetooth device connected to the terminal device 100 is an in-vehicle Bluetooth device, the terminal device 100 starts the application corresponding to the magnetic field strength threshold.

It should be noted that a navigation route that is to be used after the navigation application is started may be preset, and after the navigation application is started by using a method according to an embodiment of the present invention, navigation is directly performed for the route. For example, when the user is free, the user may enter a route in advance for which next navigation needs to be performed. Alternatively, after the navigation application is started by using a method according to an embodiment of the present invention, the user enters a navigation destination address and starts route navigation. Alternatively, after the navigation application is started by using a method according to an embodiment of the present invention, the user selects a navigation destination address from a prestored destination address list and starts route navigation.

Figure 3:
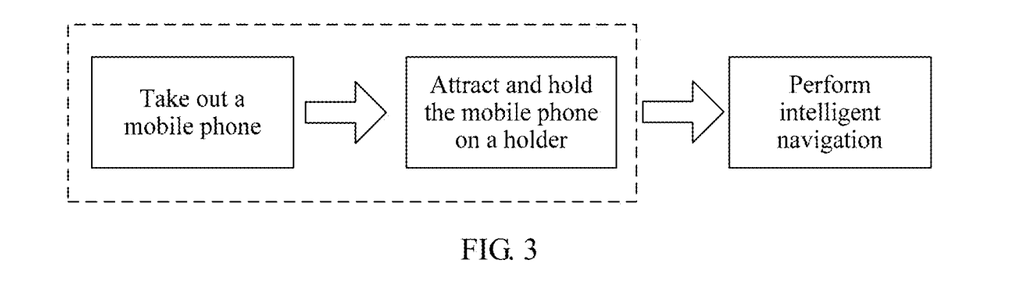
FIG. 3 is a schematic diagram of navigation application starting according to an embodiment of the present invention.

For the navigation application starting manner provided in this embodiment of the present invention, refer to FIG. 3. In this embodiment of the present invention, the magnetic field strength threshold is set, so that when the detected magnetic field strength is greater than the threshold, the navigation application can be started, and the user can use the navigation application without performing steps such as unlocking the mobile phone and searching for the navigation application, thereby implementing low-cost and simple user experience quality.

In addition, the application starting system provided in this embodiment of the present invention may be further applied to another application scenario. For example, when the user needs to watch a video by using the mobile phone, the user may need to place the mobile phone on a holder, to help the user to watch the video. Therefore, a holder that can generate specific magnetic field strength is designed, so that in a manner in which the magnetic induction sensor of the mobile phone detects the magnetic field strength, another magnetic field strength threshold can be set based on the magnetic field strength of the holder designed for watching the video on the mobile phone, and when the magnetic field strength detected by the mobile phone is greater than the another magnetic field strength threshold, a video application can be started. Likewise, the application starting method may be better used with reference to the foregoing several application scenarios or the foregoing several manners of eliminating the accidental trigger. Details are not described herein again.

It should be noted that an upper limit or a lower limit may be further set for the magnetic field strength threshold corresponding to the navigation application, so that the application starting method can be better used on the mobile phone. For example, it is assumed that the lower limit of the specified magnetic field strength threshold corresponding to the navigation application is 150 µT, and the upper limit of the magnetic field strength threshold corresponding to the navigation application is 260 µT. It is assumed that (a lower limit of) the specified magnetic field strength threshold corresponding to the video application is 300 µT. To be specific, it is assumed that when the magnetic field strength detected by the mobile phone is greater than 150 µT and less than 260 µT, the navigation application is started. Therefore, when the magnetic field strength detected by the mobile phone is greater than 300 µT, the video application is started. For example, when the mobile phone detects that the magnetic field strength is 320 µT, a processor of the mobile phone determines that 320 µT is greater than 150 µT and less than 260 µT and is greater than 300 µT, and the mobile phone starts the video application. It may be understood that an upper limit or a lower limit of the magnetic field strength is set, so that a plurality of applications are conveniently started on one terminal device by using the method provided in this embodiment of the present invention.

In a possible embodiment, when the terminal device detects that the magnetic field strength is greater than the magnetic field strength threshold and determines that a Bluetooth device connected to the terminal device is an in-vehicle Bluetooth device, the terminal device 100 starts the navigation application. However, if the terminal device 100 detects that the magnetic field strength is greater than the magnetic field strength threshold and determines that a Bluetooth device connected to the terminal device 100 is not an in-vehicle Bluetooth device, the terminal device 100 starts another application such as the video application.

It may be understood that a plurality of applications may be started by using the application starting method provided in this embodiment of the present invention, and trigger thresholds of the plurality of applications may be distinguished between each other in the manner of setting the upper limit or the lower limit of the threshold. Only two applications are used above to explain this embodiment of the present invention, and constitute no limitation on this embodiment of the present invention.

It may be understood that the terminal device may occasionally enter a high-magnetic field range, and consequently accidental application trigger is caused when a magnetic field strength value detected by the terminal device exceeds the specified magnetic field strength threshold. Such accidental trigger can be eliminated by setting the upper limit of the magnetic field strength. For example, it is assumed that the upper limit of the magnetic field strength is a value such as $10^5$ µT. When the magnetic field strength value detected by the terminal device is greater than $10^5$ µT, no application is started.

Figure 4:
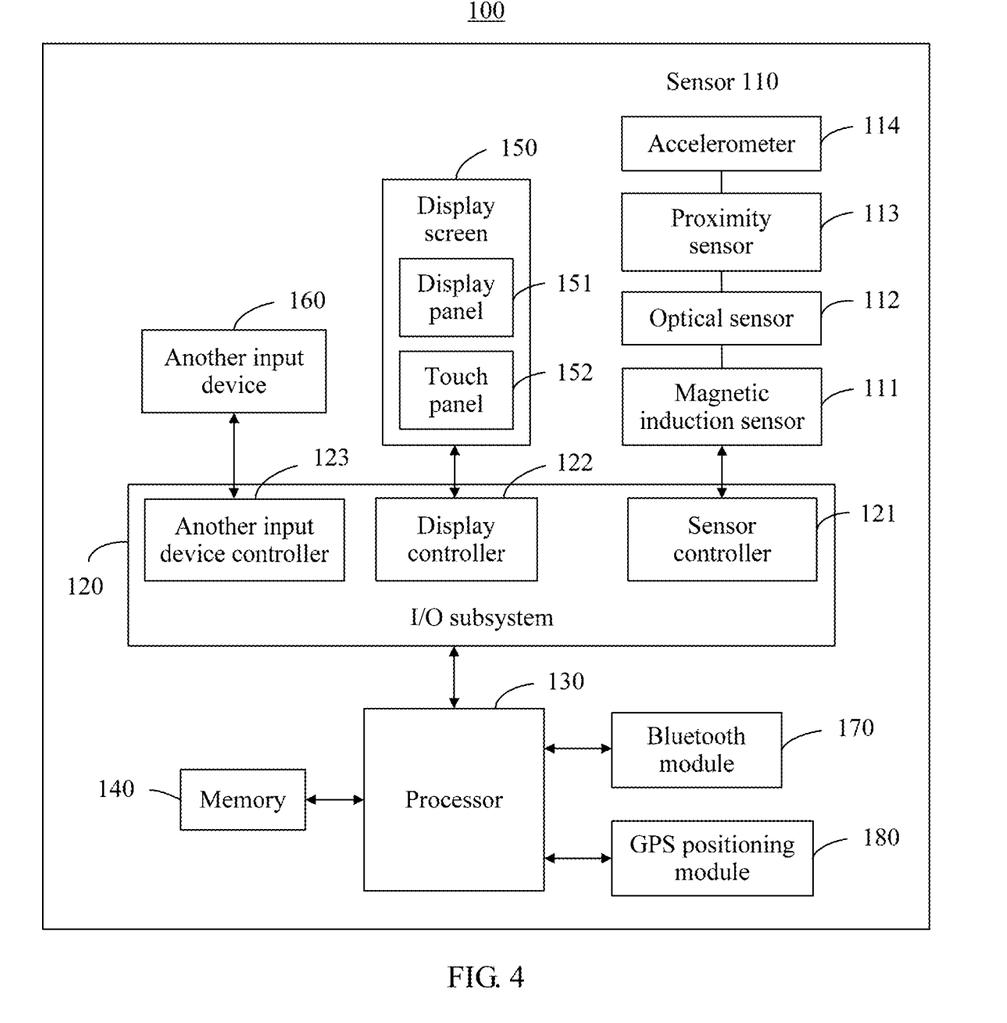
FIG. 4 is a schematic architectural diagram of a terminal device according to an embodiment of the present invention.

Correspondingly, an embodiment of the present invention provides a terminal device, to implement the system provided in the foregoing embodiment. As shown in FIG. 4, the terminal device may include a sensor 110, an I/O subsystem 120, a processor 130, a memory 140, and a display screen 150. Optionally, the terminal device may further include components such as another input device 160, a Bluetooth module 170, and a GPS positioning module 180. It should be noted that the terminal device provided in this embodiment of the present invention may include more or fewer modules, to implement an application starting method according to an embodiment of the present invention. The following describes each constituent component of the terminal device in detail with reference to FIG. 4.

The sensor 110 may include one or more of a magnetic induction sensor 111, an optical sensor 112, a proximity sensor 113, and an accelerometer 114. The magnetic induction sensor 111 is configured to detect magnetic field strength of an environment in which the terminal device is located. The optical sensor 112 is configured to detect light intensity of the environment in which the terminal device is located. The proximity sensor 113 is configured to detect a distance from an obstacle to the terminal device. The accelerometer 114 is configured to detect motion acceleration of the terminal device. In addition, the terminal device 100 may further include other sensors such as a gyroscope, a barometer, a hygrometer, a thermometer, and an infrared sensor. Details are not described herein.

The I/O subsystem 120 is configured to control an external input/output device, and may include a sensor controller 121, a display controller 122, and another input device controller 123. The sensor controller 121 may receive a signal from the magnetic induction sensor 111, the optical sensor 112, the proximity sensor 113, and the accelerometer 114, and/or send a signal to the magnetic induction sensor 111, the optical sensor 112, the proximity sensor 113, and the accelerometer 114. The display controller 122 receives a signal from the display screen 150 and/or sends a signal to the display screen 150. After the display screen 150 detects user input, the display controller 122 converts the detected user input into interaction with a user interface object displayed on the display screen 150, in other words, to implement human-machine interaction. The another input device controller 123 is configured to receive a signal from the another input device 160 and/or send a signal to the another input device 160.

The processor 130 is a control center of the terminal device 100, and connects all the components of the entire terminal device by using various interfaces and lines. By running or executing a software program and/or a module that are/is stored in the memory 140 and by invoking data stored in the memory 140, the processor 130 performs various functions of the terminal device 100 and data processing, to perform overall monitoring on the terminal device. Optionally, the processor 130 may include one or more processing units. Preferably, the processor 130 may integrate an application processor and a modem processor, and the modem processor mainly processes wireless communication. It may be understood that the modem processor may not be integrated into the processor 130. The application processor mainly processes an operating system, a user interface, an application, and the like. For example, the application processor is configured to process various applications installed on the terminal device. For example, the application processor processes a navigation application, so that the navigation application performs navigation for the terminal device 100. The application processor processes the user interface, so that a user can view a navigation route or enter a navigation destination address by using the user interface (the display screen 150).

The memory 140 may be configured to store a software program and a module, and by running the software program and the module stored in the memory 140, the processor 130 performs various function applications of the terminal device 100 and data processing. The memory 140 may mainly include a program storage area and a data storage area. The program storage area may store an operating system, an application (for example, a navigation application, a video application, or a music application) required by at least one function, and the like. The data storage area may store data (for example, an offline map, a video, or music) created based on use of the terminal device 100, and the like. In addition, the memory 140 may include a high-speed random access memory, and may further include a nonvolatile memory, for example, at least one magnetic disk storage device, a flash storage device, or another volatile solid-state storage device.

The display screen 150 may be configured to display various menus of the terminal device 100 and information entered by the user or information provided for the user, and may further receive the user input. Specifically, the display screen 150 may include a display panel 151 and a touch panel 152. The display panel 151 is configured to display the user interface, to implement human-machine interaction. The touch panel 152 is configured to receive the user input. For example, the display panel 151 is configured to display a navigation route of the navigation application. The touch panel 152 receives a destination address entered by the user on a navigation application interface.

The another input unit 160 may be configured to: receive input digit or character information, and generate key signal input related to a user setting and function control of the mobile phone 100.

The Bluetooth module 170 is configured to: connect to another Bluetooth device, and exchange data with the another Bluetooth device.

The GPS positioning module 180 is configured to: communicate with a Global Positioning System (Global Positioning System, GPS), and display location information, a map, and route information of the terminal device to the user by using the navigation application. In addition, the terminal device may further include a loudspeaker. The GPS positioning module 180 may further report the location information, the map, and the route information to the user by using the loudspeaker.

The terminal device 100 further includes a power supply (for example, a battery) that supplies power to each component. Preferably, the power supply may be logically connected to the processor 130 by using a power management system, to implement functions such as charging, discharging, and power consumption management by using the power management system.

In a specific example, the magnetic induction sensor 111 is configured to detect magnetic field strength of an environment in which the terminal device is located. The processor 130 is configured to: when the magnetic field strength is not less than a specified magnetic field strength threshold, start an application corresponding to the magnetic field strength threshold.

Preferably, the light intensity sensor 112 is configured to detect light intensity. The processor 130 is specifically configured to: when the magnetic field strength is greater than the specified magnetic field strength threshold and the light intensity is not less than a specified light intensity threshold, start the application.

Optionally, the proximity sensor 113 is configured to detect a distance from an obstacle to the terminal device. The processor 130 is specifically configured to: when the magnetic field strength is greater than the specified magnetic field strength threshold and the distance is greater than a specified distance threshold, start the application.

Optionally, the accelerometer 114 is configured to detect motion acceleration of the terminal device. The processor 130 is specifically configured to: when the magnetic field strength is greater than the specified magnetic field strength threshold and the acceleration is not less than a specified acceleration threshold, start the application.

Optionally, the processor 130 is specifically configured to: obtain a motion speed of the terminal device based on the acceleration, and when the magnetic field strength is greater than the specified magnetic field strength threshold and the speed is not less than a specified speed threshold, start the application.

Optionally, the processor 130 is specifically configured to: obtain a change rate of motion acceleration of the terminal device based on the acceleration, and when the magnetic field strength is greater than the specified magnetic field strength threshold and the change rate is not less than a specified change rate threshold, start the application.

It should be noted that the acceleration, the speed, and the change rate of the acceleration of the terminal device may also be obtained by using the GPS positioning module.

Optionally, the Bluetooth module 170 is configured to detect whether a Bluetooth device connected to the Bluetooth module 170 is an in-vehicle Bluetooth device.

Specifically, the processor 130 is specifically configured to: when the magnetic field strength is greater than the magnetic field strength threshold and at least two of the following conditions are met: the light intensity is not less than a light intensity threshold, the distance is greater than a distance threshold, the acceleration is not less than an acceleration threshold, the speed is not less than a speed threshold, the change rate is not less than a change rate threshold, and the Bluetooth device connected to the Bluetooth module is an in-vehicle Bluetooth device, start the application corresponding to the magnetic field strength threshold.

Optionally, the application is specifically a navigation application.

Optionally, the terminal device is on a magnetic holder, and the magnetic field strength threshold is set based on magnetic field strength of the magnetic holder.

Optionally, the magnetic holder is inside a moving vehicle, and the navigation application is configured to perform navigation for the moving vehicle.

Optionally, the processor 130 starts the navigation application by using the GPS positioning module 180.

In an example, an in-vehicle magnetic holder is a mobile phone accessory that is most frequently used in a vehicle currently. However, for the current in-vehicle magnetic holder, a mobile phone is attached to the holder only by attaching an iron sheet to a mobile phone housing, and consequently, the function is simplistic. In this embodiment of the present invention, a magnetic induction sensor of the mobile phone is used to detect field strength and a direction of a designed magnet, to determine a scenario that is currently needed by the user. The magnet is designed, so that the direction and absolute field strength of the magnet meet specific requirements. Herein, the designed magnet is referred to as a magnet C. The magnetic induction sensor of the mobile phone detects the field strength of the magnet and outputs three values that are respectively three pieces of data of three axes X, Y, and Z, and the three pieces of data represent magnetic field directions and strength in the three directions. When the mobile phone is in a normal state, the magnetic sensor outputs only geomagnetic field values in the X-axis, the Y-axis, and the Z-axis, and the values usually range from 40 µT to 60 µT. The values are output by the magnetic induction sensor when the mobile phone is in the normal state.

Therefore, when the mobile phone is attached to the in-vehicle magnetic holder, special field strength generated by the magnet is designed, so that a value output by the magnetic sensor of the mobile phone falls within a threshold range, for example, between 200 µT and 400 µT. In this case, a processor of the mobile phone performs determining based on a magnetic field strength value output by the magnetic induction sensor. When the output magnetic field strength value is greater than a specified magnetic field strength threshold 150 µT, the processor determines that the mobile phone needs intelligent navigation, and starts the navigation application or other navigation software having a similar function.

In this embodiment of the present invention, the magnetic induction sensor of the mobile phone cooperates with the in-vehicle magnetic holder, to implement "immediate start after absorbing and holding" of the intelligent navigation, and bring simple experience in a mobile phone scenario to the user. Specifically, the "immediate start after absorbing and holding" herein means that once the mobile phone is attached to the magnetic holder, the navigation application is started. Referring to FIG. 1 and FIG. 3, according to a method according to an embodiment of the present invention, a user application scenario that can be implemented only after six steps are performed in the prior art may be implemented by performing two steps in the present invention.

It should be noted that the magnetic field strength detected by the magnetic induction sensor may include magnetic field strength in the X-axis, the Y-axis, or the Z-axis. A person skilled in the art may understand that total magnetic field strength and a direction may be obtained by using the magnetic field strength in the X-axis, the Y-axis or the Z-axis. In other words, the magnetic field strength detected by the magnetic induction sensor may include a modulus and a direction. Specifically, for example, magnetic field strength |S| is a modulus of magnetic field strength. Magnetic field strength S is a vector, and includes a modulus and a direction of the magnetic field strength.

Further, values output by the magnetic field sensor in the X-axis, the Y-axis, and the Z-axis are specifically described herein: A relationship herein between a determining threshold and each of the X-axis, the Y-axis, and the Z-axis is as follows: Th is defined as a magnetic field strength threshold, and "vs" indicates a value comparison. For example, "Th vs X" indicates that the magnetic field strength threshold is compared with magnetic field strength in the X-axis direction. The threshold is represented as follows:

Th vs X; Th vs Y; Th vs Z; Th vs $(X^2+Y^2)$; Th vs $(X^2+Z^2)$; Th vs $(Y^2+Z^2)$;

Th vs |X|; Th vs |Y|; Th vs |Z|; Th vs (X^2+Y^2+Z^2); and Th vs [X, Y, Z].

Comparison between the magnetic field strength detected by the magnetic induction sensor and the magnetic field strength threshold Th includes but is not limited to the formulas listed above. The magnetic field strength detected by the magnetic induction sensor should include any combination of magnetic field strength detected by the magnetic induction sensor in directions of the X-axis, the Y-axis, and the Z-axis. Herein, a determining condition of a single direction is used as an example for application description. For example, the magnetic field strength in the X-axis direction is used as an example. When X>Th, it is considered that the mobile phone needs to start the intelligent navigation, and the processor of the mobile phone may start intelligent navigation software by comparing a value output by the magnetic induction sensor with the magnetic field strength threshold, so as to intelligently identify a user scenario.

Only magnetic field strength in a specific direction may be selected for sampling and comparison. Optionally, that the magnetic field strength is greater than the specified magnetic field strength threshold specifically includes: a modulus of the magnetic field strength in a first direction is greater than a modulus setting of a specified magnetic field strength threshold in the first direction. The terminal device may set the first direction based on an actual requirement. This is not limited herein. For example, the first direction may be the x-axis direction, the y-axis direction, or the z-axis direction. In addition, that the magnetic field strength is greater than the specified magnetic field strength threshold may alternatively include: a modulus of total magnetic field strength is greater than a modulus of a total magnetic field strength threshold.

It may be understood that the magnetic field strength threshold is set based on the field strength and the direction of the designed magnet. In addition, a magnetic field strength value detected by the magnetic induction sensor is also selected based on the field strength and the direction of the magnet. Specifically, a setting manner of the magnetic field strength threshold is the same as a manner of selecting the magnetic field strength value detected by the magnetic induction sensor, so as to ensure data comparability.

It may be understood that the foregoing values or letters are only used as an example and are not used as a limitation on this embodiment of the present invention.

According to the technical solutions provided in this embodiment of the present invention, the magnetic induction sensor built in the mobile phone detects the magnetic field strength and the direction, so that some user scenarios can be identified by using the magnetic field strength and the direction, thereby implementing simple and effective intelligent identification.

Figure 5:
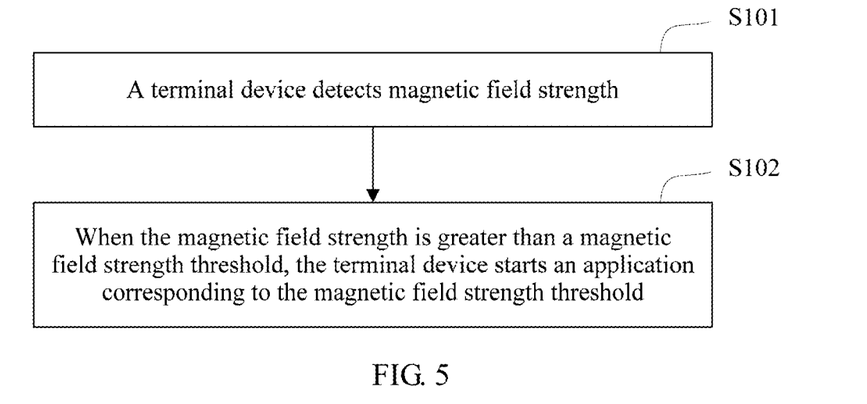
FIG. 5 is a flowchart of an application starting method according to an embodiment of the present invention.

An application starting method according to an embodiment of the present invention is described in detail below with reference to FIG. 5. FIG. 5 is a flowchart of an application starting method according to an embodiment of the present invention. In this embodiment of the present invention, the method is performed by a terminal device. As shown in FIG. 5, this embodiment specifically includes the following steps:

Step S101: The terminal device detects magnetic field strength.

Step S102: When the magnetic field strength is greater than a specified magnetic field strength threshold, the terminal device starts an application corresponding to the magnetic field strength threshold.

Optionally, before, after, or when step S101 is performed, the following step is further performed: The terminal device detects light intensity. Therefore, when the magnetic field strength is greater than the specified magnetic field strength threshold and the light intensity is not less than a specified light intensity threshold, the terminal device starts the application.

Optionally, before, after, or when step S101 is performed, the following step is further performed: The terminal device detects a distance from an obstacle to the terminal device. Therefore, when the magnetic field strength is greater than the specified magnetic field strength threshold and the distance is greater than a specified distance threshold, the terminal device starts the application.

Optionally, before, after, or when step S101 is performed, the following step is further performed: The terminal device detects motion acceleration of the terminal device. Therefore, when the magnetic field strength is greater than the specified magnetic field strength threshold and the acceleration is not less than a specified acceleration threshold, the terminal device starts the application.

Optionally, before, after, or when step S101 is performed, the following step is further performed: The terminal device detects a motion speed of the terminal device; and when the magnetic field strength is greater than the specified magnetic field strength threshold and the speed is not less than a specified speed threshold, the terminal device starts the application.

Optionally, before, after, or when step S101 is performed, the following step is further performed: The terminal device detects a change rate of motion acceleration of the terminal device. Therefore, when the magnetic field strength is greater than the specified magnetic field strength threshold and the change rate is not less than a specified change rate threshold, the terminal device starts the application.

Optionally, before, after, or when step S101 is performed, the following step is further performed: The terminal device determines whether a Bluetooth device connected to the terminal device is an in-vehicle Bluetooth device; and when the magnetic field strength is greater than the magnetic field strength threshold and the Bluetooth device connected to the terminal device is an in-vehicle Bluetooth device, the terminal device starts the application.

It should be noted that a magnetic induction sensor and an optical sensor, a proximity sensor, an accelerometer, a Bluetooth module, another sensor, or the like of the terminal device may detect parameters of the terminal device at the same time, or may detect parameters of the terminal device at different time. The parameters of the terminal device include parameters such as the magnetic field strength, the light intensity, the distance from the obstacle, the acceleration (the speed, the change rate of the acceleration), and the connected Bluetooth device.

Optionally, the application is specifically a navigation application.

Optionally, the terminal device is on a magnetic holder, and the magnetic field strength threshold is set based on magnetic field strength of the magnetic holder.

Optionally, the magnetic holder is inside a moving vehicle, and the navigation application is configured to perform navigation for the moving vehicle.

In an example, because there is a magnet inside a headset, a mobile phone, and the like, a scenario identification confusion may be caused. In this case, another sensor needs to be used for effective distinguishing. For example, when the mobile phone and the headset are placed together or when a mobile phone A and a mobile phone B are placed together, intelligent navigation is accidentally triggered. Therefore, magnet field strength may be designed to distinguish between magnet field strength of the mobile phone and that of a headset or another mobile phone. Alternatively, a current status of the mobile phone is determined by using the optical sensor or the proximity sensor. The mobile phone and the headset are usually placed together in a pocket or a bag. In this case, it may be determined, based on the optical sensor, that the mobile phone is placed in the bag, and therefore the intelligent navigation is not started. The proximity sensor of the mobile phone is usually located on the front facet of the mobile phone, and the proximity sensor is configured to detect a distance from an obstacle to the front facet of the mobile phone. In this case, it may be determined, based on the proximity sensor, that a distance from the another mobile phone or the headset to the front facet of the mobile phone is less than the distance threshold (very short), and therefore the intelligent navigation is not started.

In another example, if a holder having a magnet may be attracted and held at home, or some decorations have a magnet function, a user scenario may also be determined by using the magnetic induction sensor of the mobile phone. For example, a magnet is designed, and strength of the magnet is different from the magnet strength and the field strength direction described above. For example, the magnetic field strength and the direction of the magnet are Th1. An application scenario that is currently needed by the user can be identified by comparing a value output by the magnetic field sensor with Th1. In addition, the mobile phone can intelligently determine the scenario that is needed by the user, and start an application corresponding to the scenario for the user.

In still another example, if the scenario is identified only by using the magnetic field strength, accidental trigger occurs. Therefore, a large amount of accidental trigger may be eliminated by adding the accelerometer for a limitation in addition to identifying the magnetic field strength. For example, the magnetic field strength is identified by using the foregoing single identification method. When the mobile phone approaches a magnetic field, because the mobile phone needs to be attached to a magnetic holder, acceleration and vibration (a change rate of the acceleration) occur in a specific direction. In this case, an accelerometer change and a vibration change in a specific direction are counted and compared with specified thresholds, and if there is a significant difference, it is considered that trigger input of a specific scenario occurs.

In yet another example, when the magnetic field strength detected by the magnetic induction sensor is greater than the magnetic field strength threshold and the terminal device determines that a Bluetooth device connected to the terminal device is an in-vehicle Bluetooth device, the terminal device starts the navigation application. However, if the terminal device detects that the magnetic field strength is greater than the magnetic field strength threshold and determines that a Bluetooth device connected to the terminal device is not an in-vehicle Bluetooth device, the terminal device starts another application such as a video application.

Figure 6:
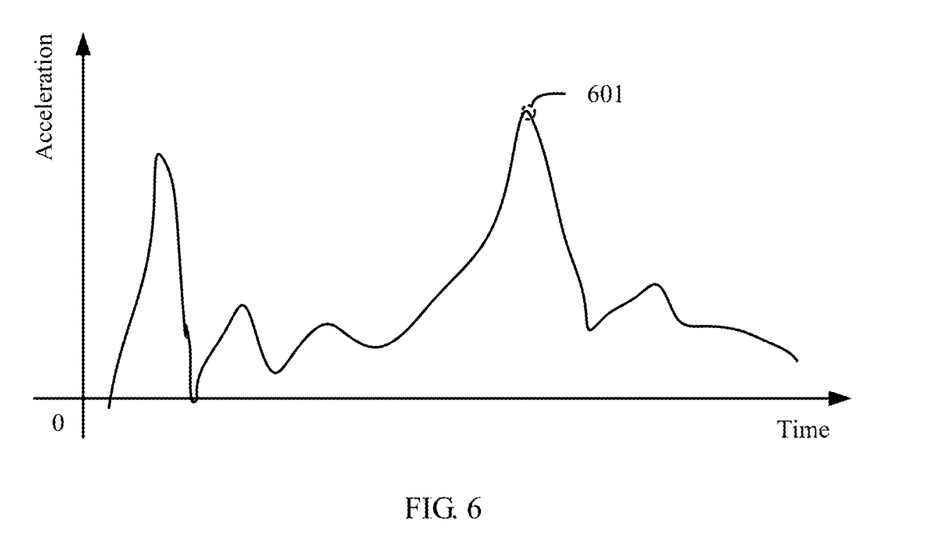
FIG. 6 is a schematic diagram of a curve representing that motion acceleration of a mobile phone varies with time.

FIG. 6 is a schematic diagram of a curve representing that motion acceleration of a mobile phone varies with time. As shown in FIG. 6, the mobile phone vibrates when being in contact with a holder. As shown by 601 in FIG. 6, an inverse change occurs on the acceleration of the mobile phone, and there is a peak value of the acceleration. In other words, inverse acceleration occurs on the mobile phone. In this case, a change rate of the acceleration of the mobile phone may be relatively high. FIG. 6 is a schematic diagram and shows changes of an accelerometer in three directions: an X-axis, a Y-axis, and a Z-axis in a period of time. Herein, for simplicity, the changes are indicated by a change in the X-axis. Actually, different changes occur in the Y-axis and the Z-axis. Therefore, changes in the X-axis, the Y-axis, and the Z-axis may be counted in a process in which the mobile phone approaches the holder, to obtain an application trigger condition.

Specifically, a magnetic induction sensor and the accelerometer jointly identify a scenario, and are different in a sequence at some time, which depends on a size of a magnetic field. If the magnetic field is large, when the mobile phone approaches the magnetic field, the mobile phone detects that a threshold of the magnetic field meets a requirement, and then the accelerometer changes when the mobile phone is attracted and held. Alternatively, an accelerometer change may be first detected, and then magnetic field strength may be detected after the accelerometer change is counted. In addition, it is feasible to simultaneously detect the accelerometer and the magnetic field strength. Correspondingly, a specific time sequence in which the sensor performs detection is not limited in this embodiment of the present invention, and may be adjusted based on an actual requirement.

This embodiment of the present invention provides a new method in which the mobile phone starts an application scenario. A magnetic field sensor of the mobile phone identifies magnetic field strength and a direction, so that an intelligent scenario is started by using software. Alternatively, a magnetic field sensor of the mobile phone and the accelerometer jointly determine and identify a scenario. Alternatively, a magnetic induction sensor of the mobile phone and another sensor jointly determine and identify a scenario. Therefore, accidental trigger caused by performing detection only by the magnetic induction sensor is reduced. In addition, low-cost and simple user experience is implemented in these new manners.

According to the application starting method and the terminal device provided in the embodiments of the present invention, the magnetic induction sensor built in the terminal device detects magnetic field strength of an external environment, so that when the magnetic field strength of the external environment is greater than the magnetic field strength threshold, the application corresponding to the magnetic field strength threshold can be started. According to the terminal device provided in the embodiments of the present invention, the application is started more quickly and more conveniently by detecting the magnetic field strength, so as to implement low-cost and simple user experience.

Figure 7:
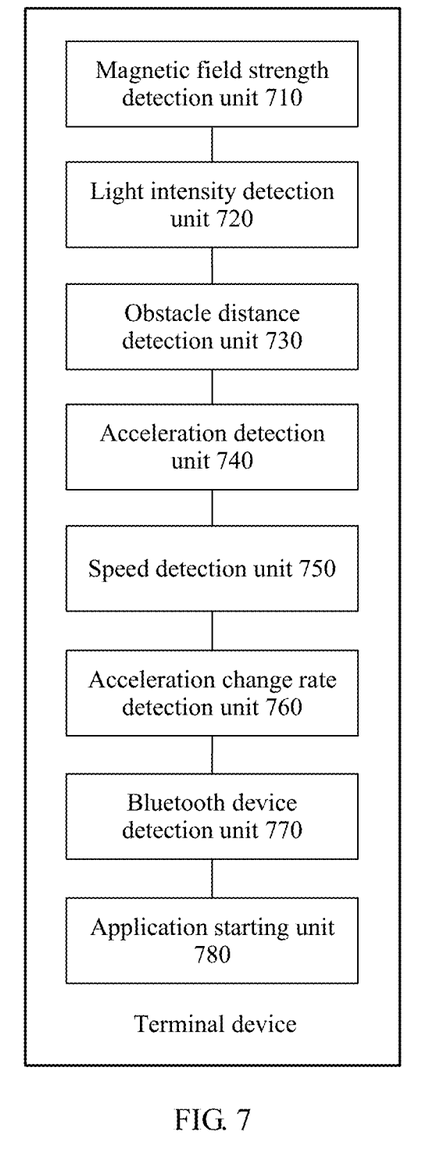
FIG. 7 is a schematic architectural diagram of another terminal device according to an embodiment of the present invention.

Correspondingly, FIG. 7 is a schematic structural diagram of another terminal device according to an embodiment of the present invention. The terminal device is also configured to implement the system and the application starting method provided in the foregoing embodiments. As shown in FIG. 7, the another terminal device provided in this embodiment of the present invention includes a magnetic field strength detection unit 710, a light intensity detection unit 720, an obstacle distance detection unit 730, an acceleration detection unit 740, a speed detection unit 750, an acceleration change rate detection unit 760, a Bluetooth device detection unit 770, and an application starting unit 780.

The magnetic field strength detection unit 710 is configured to detect magnetic field strength. The application starting unit 780 is configured to: when the detected magnetic field strength is greater than a magnetic field strength threshold, start an application corresponding to the magnetic field strength threshold. The application is specifically a navigation application.

In addition, the terminal device shown in FIG. 7 may include more or fewer units, to implement the application starting method provided in the embodiments of the present invention.

Specifically, the light intensity detection unit 720 is configured to detect light intensity. The obstacle distance detection unit 730 is configured to detect a distance from an obstacle to the terminal device. The acceleration detection unit 740 is configured to detect motion acceleration of the terminal device. The speed detection unit 750 is configured to detect a motion speed of the terminal device. The acceleration change rate detection unit 760 is configured to detect a change rate of motion acceleration of the terminal device. The Bluetooth device detection unit 770 is configured to detect whether a Bluetooth device connected to the Bluetooth device detection unit 770 is an in-vehicle Bluetooth device.

Further, the application starting unit 780 is specifically configured to: when the magnetic field strength is greater than the magnetic field strength threshold and at least two of the following conditions are met: the light intensity is not less than a light intensity threshold, the distance is greater than a distance threshold, the acceleration is not less than an acceleration threshold, the speed is not less than a speed threshold, the change rate is not less than a change rate threshold, and the Bluetooth device detection unit 770 detects that the connected Bluetooth device is an in-vehicle Bluetooth device, start the application corresponding to the magnetic field strength threshold.

A person skilled in the art may be further aware that, in combination with the examples described in the embodiments disclosed in this specification, units and algorithm steps may be implemented by electronic hardware, computer software, or a combination thereof. To clearly describe the interchangeability between the hardware and the software, the foregoing has generally described compositions and steps of each example according to functions. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

A person of ordinary skill in the art may understand that all or some steps in the foregoing method of the embodiments may be implemented by a program instructing a processor. The foregoing program may be stored in a computer readable storage medium. The storage medium is a non-transitory (English: non-transitory) medium such as a random access memory, a read-only memory, a flash memory, a hard disk, a solid-state drive, a magnetic tape (English: magnetic tape), a floppy disk (English: floppy disk), an optical disc (English: optical disc), or any combination thereof.

The foregoing descriptions are merely example implementations of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. An application starting method, wherein the method comprises:
   detecting, by a terminal device, magnetic field strength; and
   when the magnetic field strength is greater than a magnetic field strength threshold, starting, by the terminal device, an application corresponding to the magnetic field strength threshold; wherein the method further comprises:
   detecting, by the terminal device, light intensity;
   detecting, by the terminal device, a distance from an obstacle to the terminal device;
   detecting, by the terminal device, motion acceleration of the terminal device;
   detecting, by the terminal device, a motion speed of the terminal device;
   detecting, by the terminal device, a change rate of the motion acceleration of the terminal device;
   detecting, by the terminal device, whether a Bluetooth device connected to the terminal device is an in-vehicle Bluetooth device; and
   wherein when the magnetic field strength is greater than a magnetic field strength threshold, starting, by the terminal device, an application corresponding to the magnetic field strength threshold comprises:
   when the magnetic field strength is greater than the magnetic field strength threshold and at least two of the following conditions are met: the light intensity is not less than a light intensity threshold, the distance is greater than a distance threshold, the acceleration is not less than an acceleration threshold, the speed is not less than a speed threshold, the change rate is not less than a change rate threshold, and the Bluetooth device connected to the terminal device is an in-vehicle Bluetooth device, starting, by the terminal device, the application corresponding to the magnetic field strength threshold.

2. The method according to claim 1, wherein the method further comprises:
   detecting, by the terminal device, the light intensity; and
   wherein when the magnetic field strength is greater than the magnetic field strength threshold, starting, by the terminal device, an application corresponding to the magnetic field strength threshold comprises:
   when the magnetic field strength is greater than the magnetic field strength threshold and the light intensity is not less than the light intensity threshold, starting, by the terminal device, the application.

3. The method according to claim 1, wherein the method further comprises:
   detecting, by the terminal device, the motion acceleration of the terminal device; and wherein when the magnetic field strength is greater than the magnetic field strength threshold, starting, by the terminal device, the application corresponding to the magnetic field strength threshold comprises:
   when the magnetic field strength is greater than the magnetic field strength threshold and the acceleration is not less than the acceleration threshold, starting, by the terminal device, the application.

4. The method according to claim 1, wherein the method further comprises:
   detecting, by the terminal device, the motion speed of the terminal device; and wherein when the magnetic field strength is greater than the magnetic field strength threshold, starting, by the terminal device, the application corresponding to the magnetic field strength threshold comprises:
when the magnetic field strength is greater than the magnetic field strength threshold and the speed is not less than the speed threshold, starting, by the terminal device, the application for migrating the program to be executed.

5. The method according to claim 1, wherein the method further comprises:
detecting, by the terminal device, the change rate of motion acceleration of the terminal device; and
wherein when the magnetic field strength is greater than the magnetic field strength threshold, starting, by the terminal device, the application corresponding to the magnetic field strength threshold comprises:
when the magnetic field strength is greater than the magnetic field strength threshold and the change rate is not less than the change rate threshold, starting, by the terminal device, the application.

6. The method according to claim 1, wherein the method further comprises:
detecting, by the terminal device, whether the Bluetooth device connected to the terminal device is the in-vehicle Bluetooth device; and
wherein when the magnetic field strength is greater than the magnetic field strength threshold, starting, by the terminal device, the application corresponding to the magnetic field strength threshold comprises:
when the magnetic field strength is greater than the magnetic field strength threshold and the Bluetooth device connected to the terminal device is the in-vehicle Bluetooth
device, starting, by the terminal device, the application.

7. A terminal device, wherein the terminal device comprises a magnetic induction sensor and at least one processor, wherein:
the magnetic induction sensor is configured to detect magnetic field strength; and
the at least one processor is configured to:
when the magnetic field strength is not less than a magnetic field strength threshold, start an application the magnetic field strength threshold;
wherein the terminal device further comprises:
a light intensity sensor, the light intensity sensor configured to detect light intensity;
a proximity sensor, the proximity sensor configured to detect a distance from an obstacle to the terminal device;
an accelerometer, the accelerometer configured to detect motion acceleration of the terminal device, wherein:
the at least one processor is further configured to obtain a motion speed of the terminal device based on the acceleration, and the terminal device detects the light intensity; and
the at least one processor is further configured to obtain a change rate of the motion acceleration of the terminal device based on the acceleration; and
a Bluetooth module, the Bluetooth module configured to detect whether a Bluetooth device connected to the Bluetooth module is an in-vehicle Bluetooth device, wherein:
the at least one processor is configured to:
when the magnetic field strength is greater than the magnetic field strength threshold and at least two of the following conditions are met: the light intensity is not less than a light intensity threshold, the distance is greater than a distance threshold, the acceleration is not less than an acceleration threshold, the speed is not less than a speed threshold, the change rate is not less than a change rate threshold, and the Bluetooth device connected to the Bluetooth module is an in-vehicle Bluetooth device, start the application corresponding to the magnetic field strength threshold.

8. The terminal device according to claim 7, wherein the terminal device further comprises the proximity sensor, wherein:
the proximity sensor is configured to detect the distance from the obstacle to the terminal device; and
the at least one processor is configured to:
when the magnetic field strength is greater than the magnetic field strength threshold and the distance is greater than the distance threshold, start the application.

9. The terminal device according to claim 7, wherein the terminal device further comprises the accelerometer, wherein:
the accelerometer is configured to detect motion acceleration of the terminal device; and
the at least one processor is configured to:
when the magnetic field strength is greater than the magnetic field strength threshold and the acceleration is not less than the acceleration threshold, start the application.

10. The terminal device according to claim 7, wherein the at least one processor is further configured to obtain the motion speed of the terminal device based on the acceleration; and
the at least one processor is configured to:
when the magnetic field strength is greater than the magnetic field strength threshold and the speed is not less than the speed threshold, start the application.

11. The terminal device according to claim 7, wherein the at least one processor is further configured to obtain the change rate of motion acceleration of the terminal device based on the acceleration; and
the at least one processor is configured to:
when the magnetic field strength is greater than the magnetic field strength threshold and the change rate is not less than the change rate threshold, start the application.

12. The terminal device according to claim 7, wherein the terminal device further comprises the Bluetooth module, wherein:
the Bluetooth module is configured to detect whether the Bluetooth device connected to the Bluetooth module is the in-vehicle Bluetooth device; and the at least one processor is configured to:
when the magnetic field strength is greater than the magnetic field strength threshold and the Bluetooth device connected to the Bluetooth module is the in-vehicle Bluetooth device, start the application.

13. A terminal device, comprising:
a magnetic field strength sensor, the magnetic field strength sensor configured to detect magnetic field strength; and
at least one processor, the at least one processor configured to:
when the magnetic field strength is greater than a magnetic field strength threshold, start an application corresponding to the magnetic field strength threshold;

the terminal device further comprises: a light intensity sensor, the light intensity sensor configured to detect light intensity;

an obstacle distance sensor, the obstacle distance sensor configured to detect a distance from an obstacle to the terminal device;

an acceleration sensor, the acceleration sensor configured to detect motion acceleration of the terminal device;

a speed sensor, the speed sensor configured to detect a motion speed of the terminal device;

an acceleration change rate sensor, the acceleration change rate sensor configured to detect a change rate of the motion acceleration of the terminal device; and a Bluetooth device sensor, the Bluetooth device sensor configured to detect whether a Bluetooth device connected to the Bluetooth device sensor is an in-vehicle Bluetooth device, wherein:

the at least one processor is configured to:

when the magnetic field strength is greater than the magnetic field strength threshold and at least two of the following conditions are met: the light intensity is not less than a light intensity threshold, the distance is greater than a distance threshold, the acceleration is not less than an acceleration threshold, the speed is not less than a speed threshold, the change rate is not less than a change rate threshold, and the Bluetooth device sensor detects that the connected Bluetooth device is an in-vehicle Bluetooth device, start the application corresponding to the magnetic field strength threshold.

14. The terminal device according to claim 13, further comprising:

the acceleration sensor, the acceleration sensor configured to the detect motion acceleration of the terminal device, wherein:

the at least one processor is configured to:

when the magnetic field strength is greater than the magnetic field strength threshold and the acceleration is not less than the acceleration threshold, start the application.

15. The terminal device according to claim 13, further comprising:

the speed sensor, the speed sensor configured to detect the motion speed of the terminal device, wherein:

the at least one processor is configured to:

when the magnetic field strength is greater than the magnetic field strength threshold and the speed is not less than the speed threshold, start the application.

16. The terminal device according to claim 13, further comprising:

an acceleration change rate sensor, the acceleration change rate sensor configured to detect the change rate of the motion acceleration of the terminal device, wherein:

the at least one processor is configured to:

when the magnetic field strength is greater than the magnetic field strength threshold and the change rate is not less than the change rate threshold, start the application.

17. The terminal device according to claim 13, further comprising:

the Bluetooth device sensor, the Bluetooth device sensor configured to detect whether a Bluetooth device connected to the Bluetooth device sensor is the in-vehicle Bluetooth device, wherein:

the at least one processor is configured to:

when the magnetic field strength is greater than the magnetic field strength threshold and the Bluetooth device sensor detects that the connected Bluetooth device is the in-vehicle Bluetooth device, start the application.

* * * * *